United States Patent
Haraguchi et al.

(10) Patent No.: US 9,969,291 B2
(45) Date of Patent: May 15, 2018

(54) SWITCHING BOARD

(71) Applicants: AutoNetworks Technologies, Ltd., Yokkaichi (JP); Sumitomo Wiring Systems, Ltd, Suzuka (JP); Sumitomo Electric Industries, Ltd., Osaka (JP)

(72) Inventors: Akira Haraguchi, Mie (JP); Manabu Hashikura, Mie (JP); Hideo Morioka, Mie (JP); Hideaki Tahara, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 71 days.

(21) Appl. No.: 15/036,730

(22) PCT Filed: Nov. 10, 2014

(86) PCT No.: PCT/JP2014/079691
§ 371 (c)(1),
(2) Date: May 13, 2016

(87) PCT Pub. No.: WO2015/072417
PCT Pub. Date: May 21, 2015

(65) Prior Publication Data
US 2016/0264014 A1    Sep. 15, 2016

(30) Foreign Application Priority Data

Nov. 13, 2013  (JP) ................. 2013-234818

(51) Int. Cl.
*B60L 11/18* (2006.01)
*H03K 17/12* (2006.01)
*H03K 17/10* (2006.01)

(52) U.S. Cl.
CPC ........ *B60L 11/1851* (2013.01); *H03K 17/102* (2013.01); *H03K 17/122* (2013.01)

(58) Field of Classification Search
None
See application file for complete search history.

(56) References Cited

U.S. PATENT DOCUMENTS 7,046,535 B2 *  5/2006  Rodriguez ............ H02M 7/003
                                                 307/112
7,928,607 B2 *  4/2011  Oliver .................. H02J 7/0029
                                                 307/113

(Continued)

FOREIGN PATENT DOCUMENTS

EP        0945959 A2    9/1999
JP      2003164039 A    6/2003

(Continued)

OTHER PUBLICATIONS

Oct. 19, 2016 European Search Report.

*Primary Examiner* — Jared Fureman
*Assistant Examiner* — Joel Barnett
(74) *Attorney, Agent, or Firm* — Dinsmore & Shohl LLP

(57) ABSTRACT

A switching board includes: a control circuit board that has, on a first surface thereof, a control circuit, a connection circuit, a first mounting window, and a second mounting window; a circuit structure including an input bus bar and an output bus bar are arranged on a second surface of the control circuit board; and a first and second semiconductor switching element. The first semiconductor switching element is arranged inside the first mounting window. The drain terminal, the source terminal, and the gate terminal of the first semiconductor switching element are connected respectively to the input bus bar, the connection circuit, and the control circuit. The second semiconductor switching element is arranged inside the second mounting window. The (Continued)

drain terminal, the source terminal, and the gate terminal of the second semiconductor switching element are connected respectively to the output bus bar, the connection circuit, and the control circuit.

2 Claims, 10 Drawing Sheets

(56) References Cited

U.S. PATENT DOCUMENTS

| | | | |
|---|---|---|---|
| 2003/0137813 A1* | 7/2003 | Onizuka | H05K 1/0263 361/777 |
| 2005/0151508 A1 | 7/2005 | Cook et al. | |
| 2006/0290689 A1* | 12/2006 | Grant | H02M 7/003 345/204 |
| 2009/0009978 A1 | 1/2009 | Fujimaki | |
| 2011/0127830 A1 | 6/2011 | Harding | |

FOREIGN PATENT DOCUMENTS

| | | |
|---|---|---|
| JP | 2006060949 A | 3/2006 |
| JP | 2006310557 A | 11/2006 |
| JP | 2009017705 A | 1/2009 |
| JP | 2009146933 A | 7/2009 |
| JP | 2010126963 A | 6/2010 |
| JP | 2013187488 A | 9/2013 |

* cited by examiner

SWITCHING BOARD

CROSS-REFERENCE TO RELATED APPLICATIONS

This application is the U.S. National Phase of PCT/JP2014/079691 filed Nov. 10, 2014, which claims priority of Japanese Patent Application No. 2013-234818 filed Nov. 13, 2013.

TECHNICAL FIELD

The present invention relates to switching boards.

BACKGROUND

In recent years, automobiles on which an auxiliary power supply is mounted in addition to a main battery have been developed in order to improve fuel consumption and due to concern about the environment. For example, it is possible to reduce the power generation of an alternator and improve fuel consumption by storing regenerative energy at the time of braking in the auxiliary power supply and using the regenerative energy in power supply to electrical components during driving. Furthermore, an instantaneous power interruption of electrical components and degradation of the main battery due to a momentary drop of the main battery voltage can be prevented by supplying power to a starter from the auxiliary power supply when restarting an engine after turning off the engine when stopping.

There are cases where a switching board having a function of switching the power supply mode in association with operation status of a vehicle, such as driving or turning off the engine when stopping, is installed between the main battery and the auxiliary power supply.

Conventionally, a board having a mechanical relay capable of dealing with a large current has been used as the switching board, whereas replacement of the mechanical relay with a semiconductor switching element has been proposed in order to reduce the size, prolong the lifetime, and reduce the noise. It is expected that a power semiconductor device such as a MOSFET (Metal-Oxide-Semiconductor Field-Effect Transistor) is used as the semiconductor switching element (see Patent Document 1).

In general, a parasitic diode with a pn junction is generated between the source and the drain in switches using a MOSFET. Accordingly, a current flows through this parasitic diode from the source to the drain even if the gate is turned off, and accordingly, the current flow from the source to the drain cannot be completely shut down. In order to make it possible to shut down currents in both directions, two MOSFETs are connected in series such that the orientations of the aforementioned parasitic diodes are opposite.

However, if such a complicated circuit is designed, the structure of the switching board tends to be complicated.

SUMMARY

The present invention has been completed based on the foregoing situation, and an object of the invention is to provide a switching board having a simple configuration that is installed in a vehicle having a main power supply and an auxiliary power supply, between the main power supply and the auxiliary power supply.

The present invention is a switching board to be arranged between a main power supply and an auxiliary power supply of a vehicle, the switching board comprises a circuit structure including an insulating plate that has a first surface and a second surface and is made of an insulating material; a conductive circuit arranged on the first surface of the insulating plate; a control circuit board including a plurality of mounting windows that pass through from the first surface to the second surface of the insulating plate; an input bus bar and an output bus bar that are spaced apart from each other on the second surface of the insulating plate; and a plurality of semiconductor switching elements mounted on the circuit structure and each having a drain terminal, a source terminal, and a gate terminal, wherein the conductive circuit includes a control circuit, and a connection circuit arranged between the input bus bar and the output bus bar, at least one of the plurality of mounting windows is a first mounting window, wherein a part of the input bus bar is exposed inside of the first mounting window, and at least another one of the mounting windows is a second mounting window, wherein a part of the output bus bar is exposed inside of the second mounting window, and at least one of the plurality of semiconductor switching elements is a first semiconductor switching element arranged inside the first mounting window, the drain terminal of the first semiconductor switching element being connected to a part of the input bus bar, the source terminal of the first semiconductor switching element being connected to the connection circuit, and the gate terminal of the first semiconductor switching element being connected to the control circuit, and at least another one of the semiconductor switching elements being a second semiconductor switching element arranged inside the second mounting window, the drain terminal of the second semiconductor switching element being connected to a part of the output bus bar, the source terminal of the second semiconductor switching element being connected to the connection circuit, and the gate terminal of the second semiconductor switching element being connected to the control circuit.

With the above configuration, it is possible to simply lay out the bus bars, the control circuit board, and the semiconductor switching element that are necessary for the switching board to be installed between a main power supply and an auxiliary power supply, and to provide a switching board having a simple configuration.

The following configuration is favorable as an embodiment of the present invention.

An end edge of the input bus bar facing the output bus bar side may have a plurality of first projecting portions that project toward the output bus bar. The input bus bar may include a first recess portion that is recessed to a side opposite of the output bus bar, the first recess portion being arranged between two adjacent first projecting portions. An end edge of the output bus bar facing the input bus bar may include a plurality of second projecting portions that project toward the input bus bar. The output bus bar may include a second recess portion that is recessed to a side opposite to the input bus bar, the second recess portion being arranged between two adjacent second projecting portions.

According to the above configuration, it is possible to avoid breakage of the control circuit board along a gap between the input bus bar and the output bus bar when unexpected large force is applied to the switching board.

According to the present invention, it is possible to provide a switching device having a simple configuration that is installed in a vehicle having a main power supply and an auxiliary power supply, between the main power supply and the auxiliary power supply.

DETAILED DESCRIPTION

Figure 8:
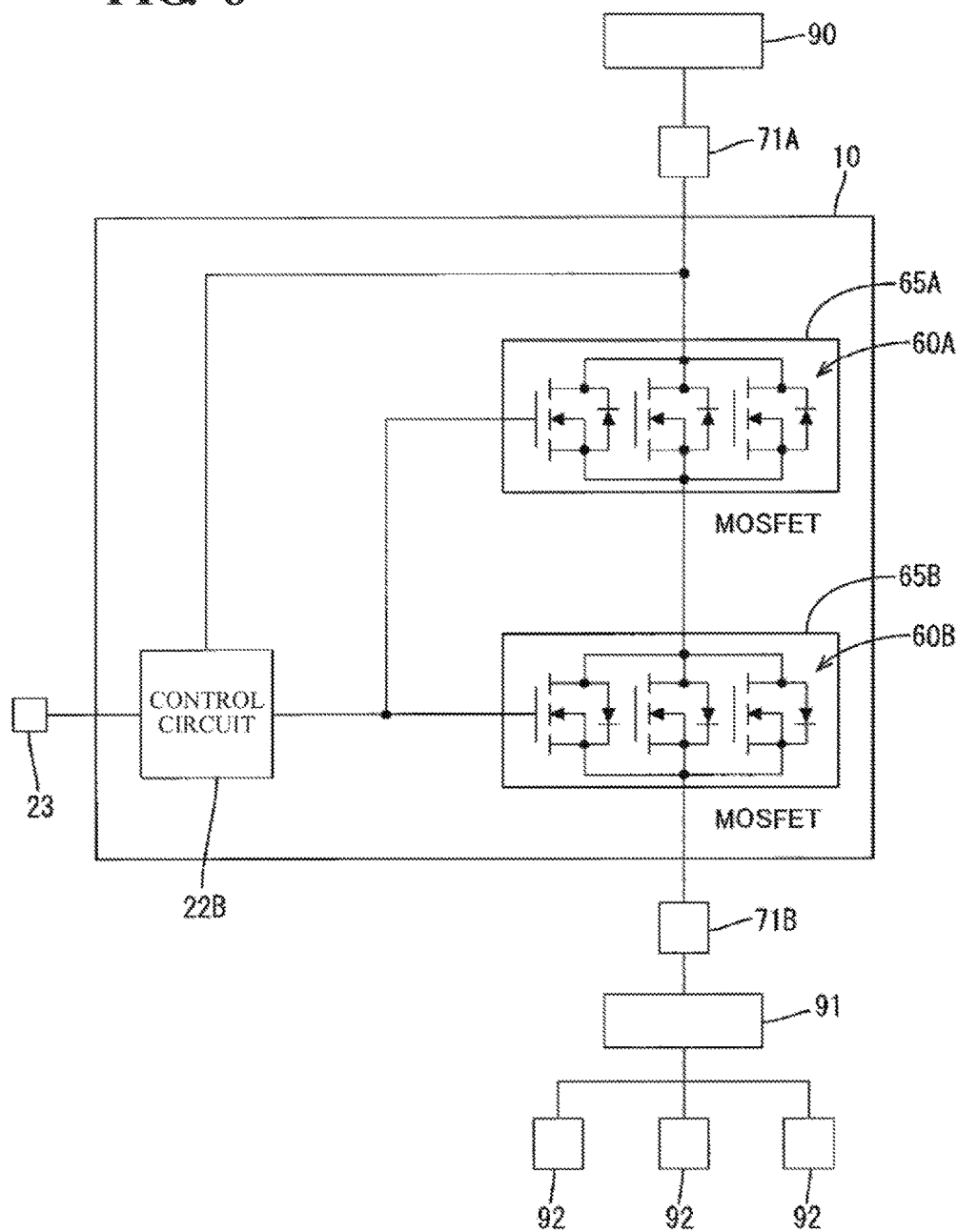
FIG. 8 is a diagram showing a circuit configuration of the switching device according to the embodiment.
Figure 9:
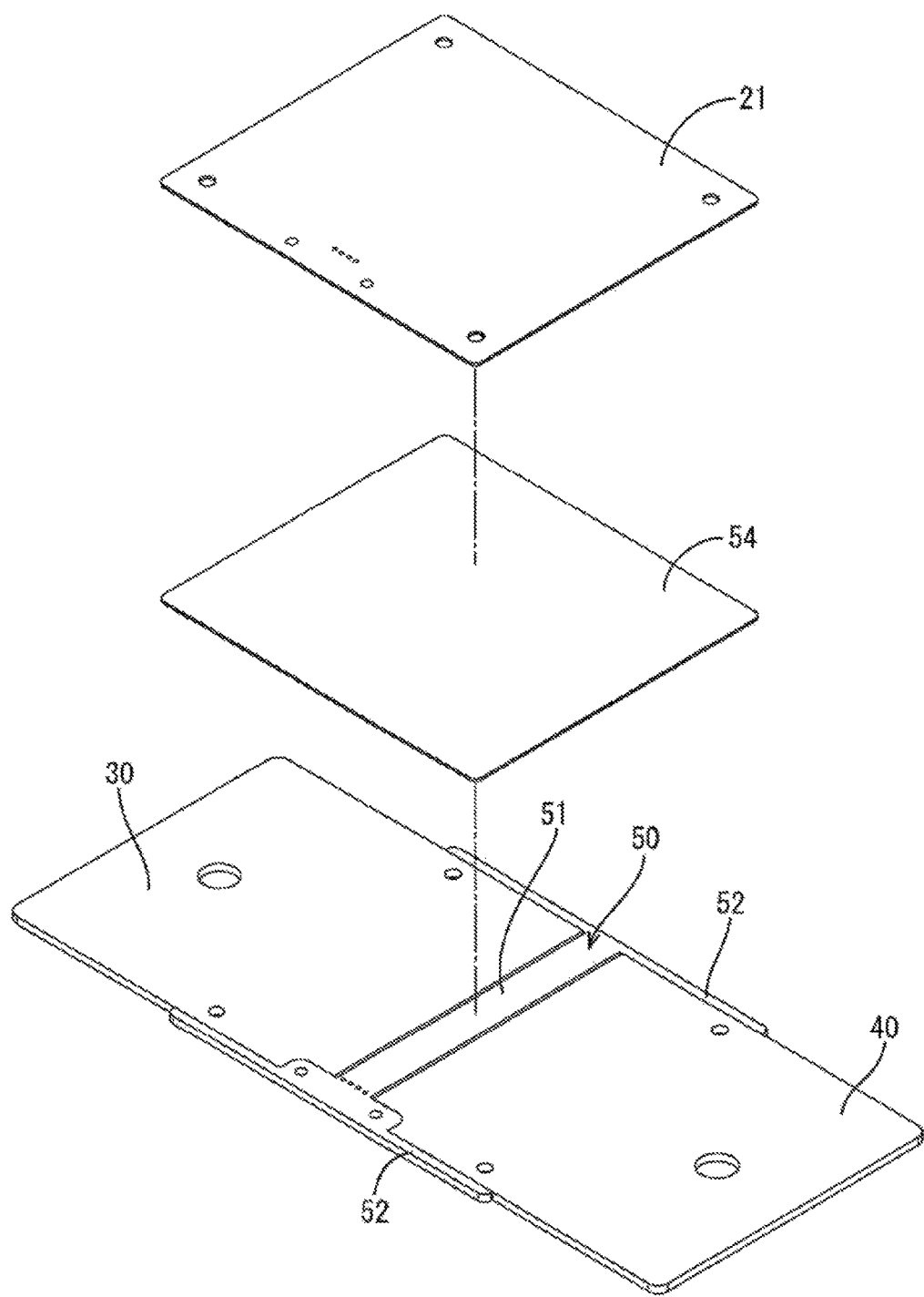
FIG. 9 is a diagram showing an exemplary method for manufacturing a circuit structure according to the embodiment.

An embodiment of the present invention will be described with reference to FIGS. 1 to 9. A switching device 1 according to an embodiment for use in a vehicle having a main battery 90, which corresponds to a main power supply, and an auxiliary battery 91, which corresponds to an auxiliary power supply. The switching device 1 is for switching power supply from the main battery 90 and the auxiliary battery 91 to electrical components 92. As shown in FIG. 8, the main battery 90 and the auxiliary battery 91 are arranged in series, and supply power to the electrical components 92. The switching device 1 is arranged between the main battery 90 and the auxiliary battery 91 in series with the main battery 90 and the auxiliary battery 91.

Figure 1:
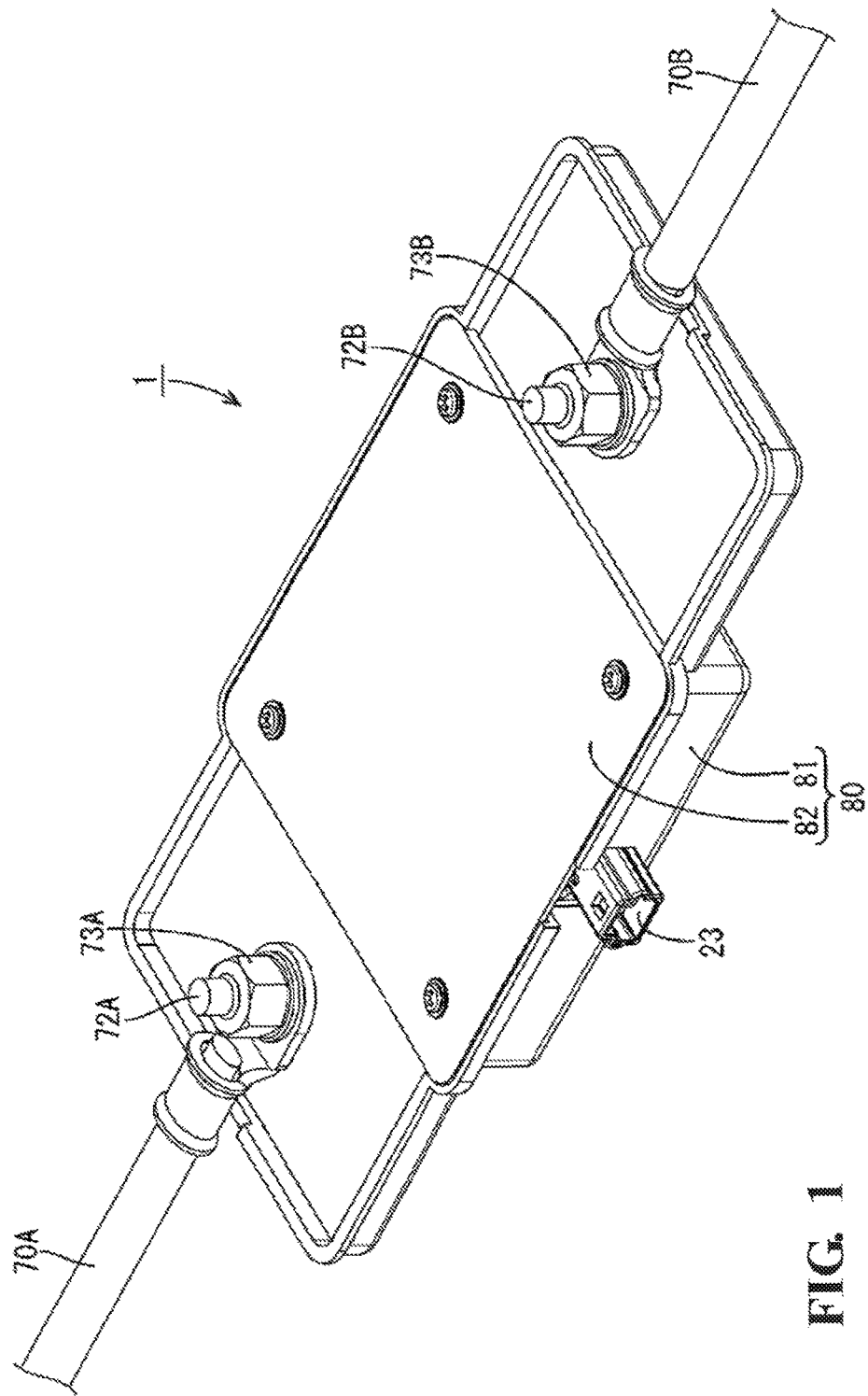
FIG. 1 is a perspective view of a switching device according to an embodiment.
Figure 2:
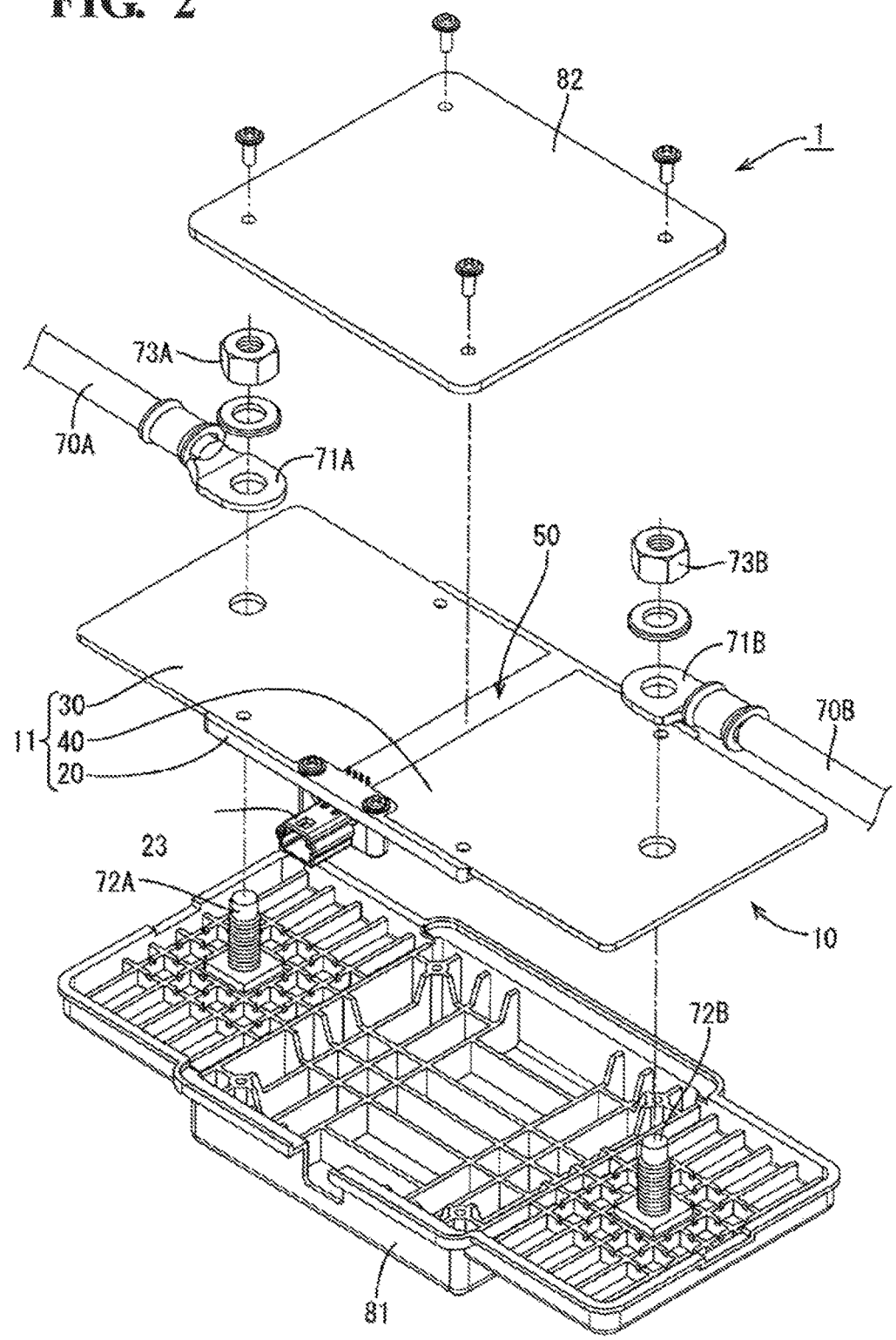
FIG. 2 is an exploded perspective view of the switching device according to the embodiment.

As shown in FIGS. 1 and 2, the switching device 1 includes a switching board 10 and a casing 80 for housing this switching board 10. The switching board 10 includes a circuit structure 11, and six semiconductor switching elements 60A and 60B that are mounted to the circuit structure 11. The circuit structure 11 includes a control circuit board 20, two bus bars 30 and 40 that overlap the control circuit board 20 via an adhesion layer 53, and a separator 50.

The control circuit board 20 has an insulating plate 21, which has a first surface and a second surface and is made of a glass material or a nonwoven glass material. The control circuit board 20 is a printed board that has a conductive circuit 22, which is made of a conductive material, on the first surface side of the aforementioned insulating plate 21. A connector 23 for connecting the control circuit board 20 to an external control device (not shown) is arranged at one end of the control circuit board 20.

Figure 4:
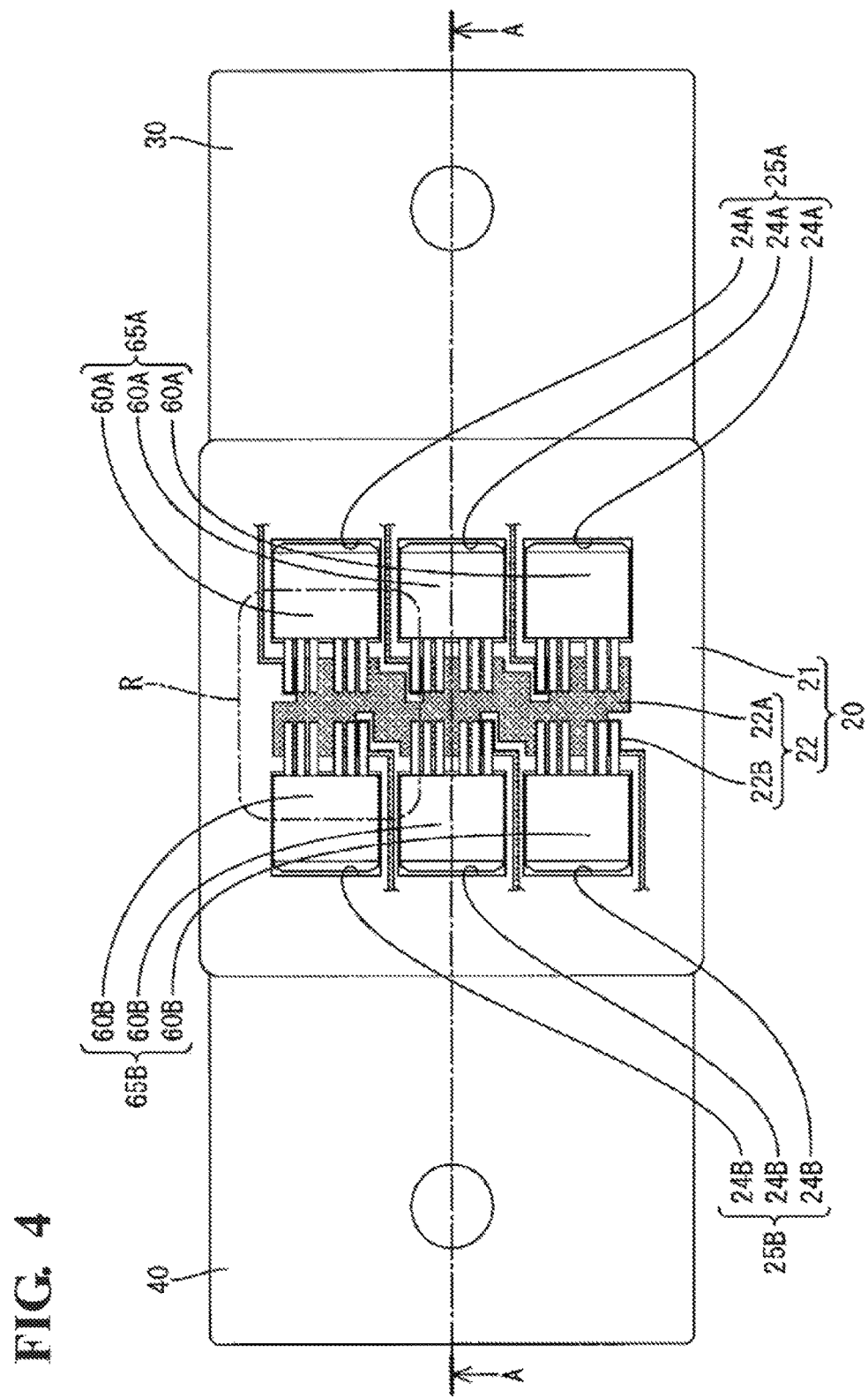
FIG. 4 is a plan view of the switching board according to the embodiment.
Figure 5:
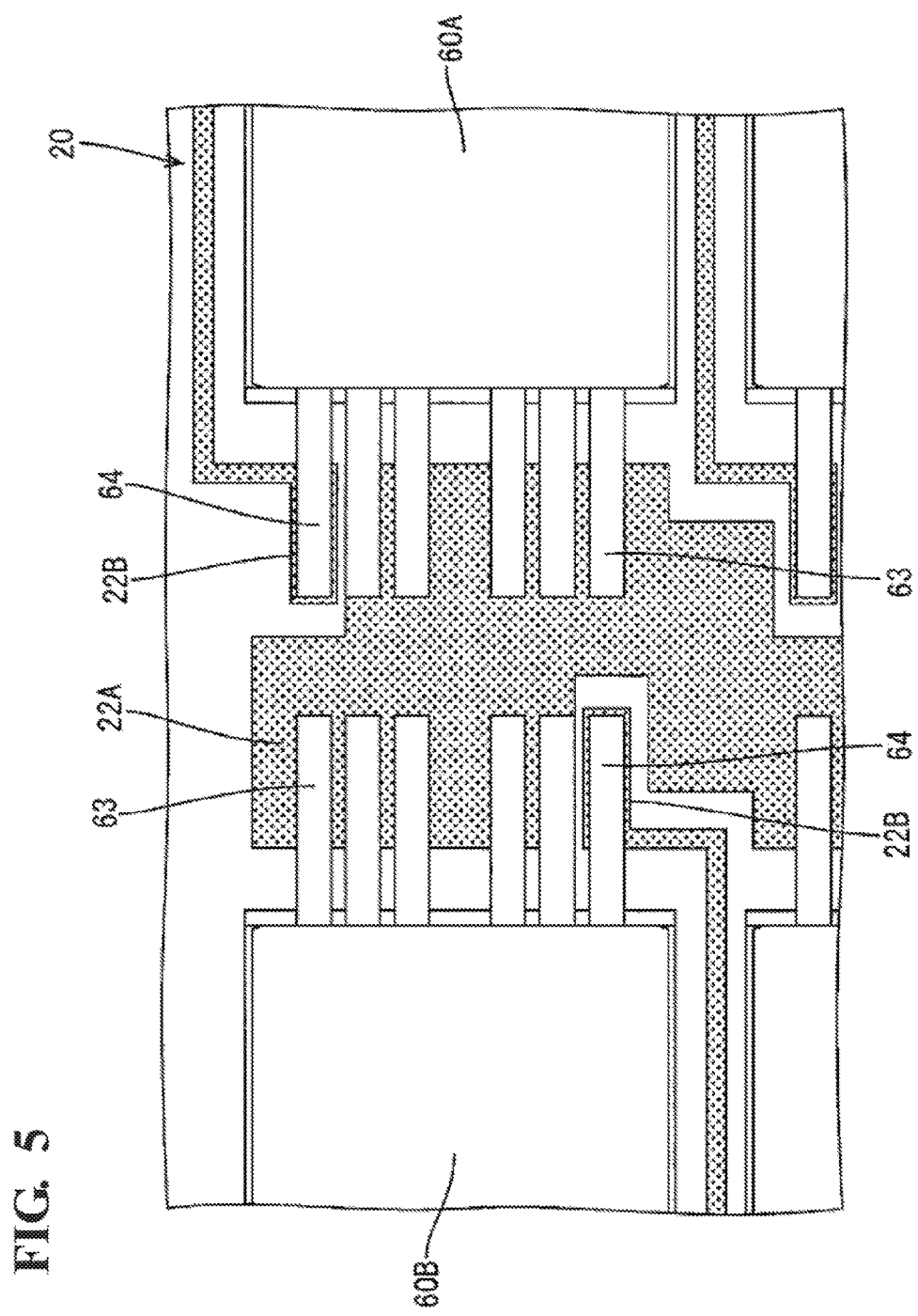
FIG. 5 is an enlarged view of a region R in FIG. 4.
Figure 6:
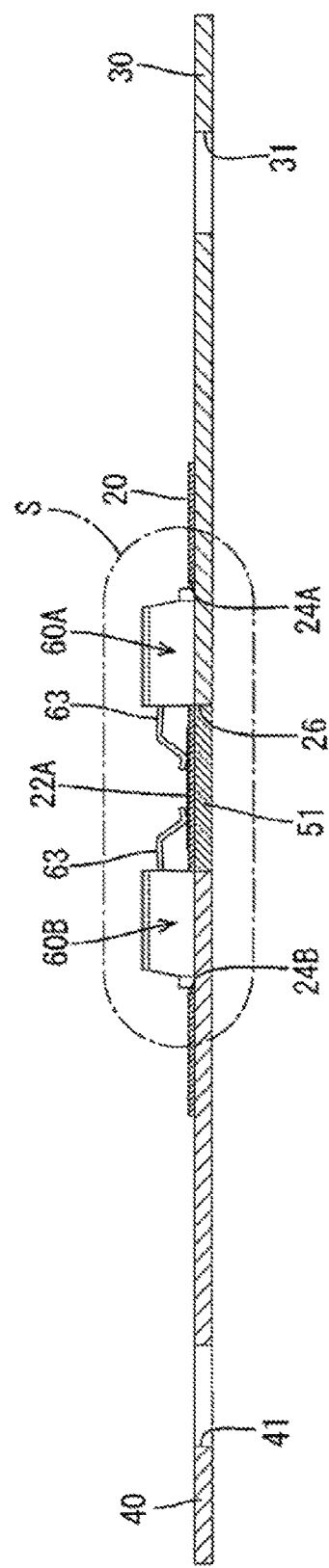
FIG. 6 is a cross-sectional view of FIG. 4 taken along line A-A.
Figure 7:
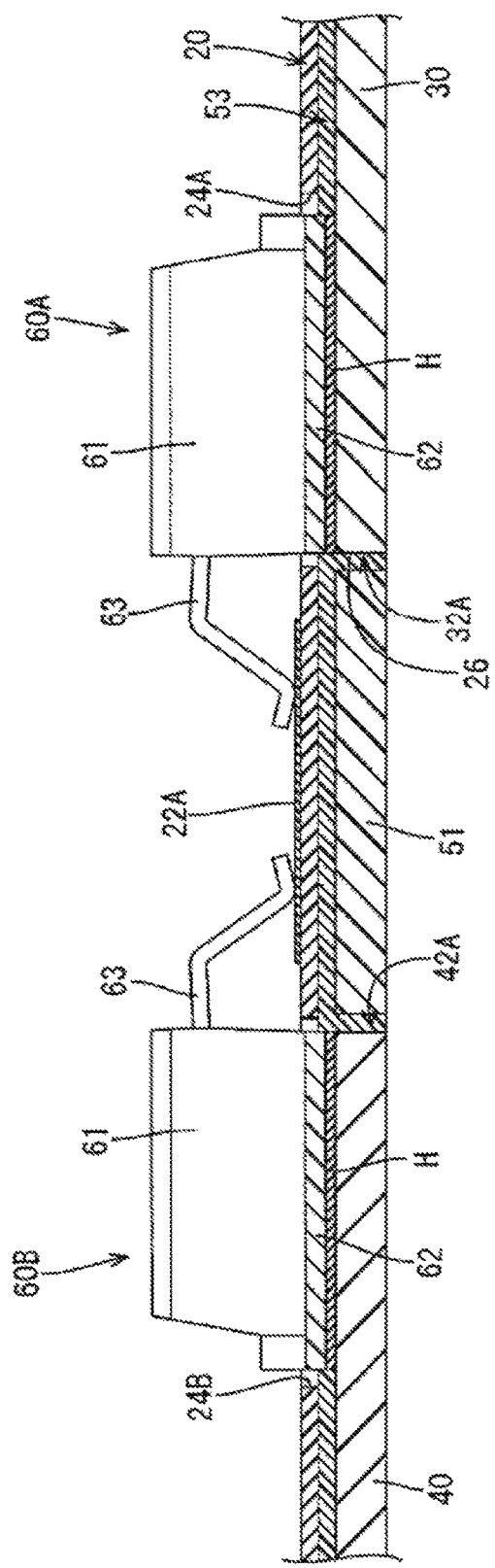
FIG. 7 is an enlarged view of a region S in FIG. 6.

As shown in FIG. 4, the control circuit board 20 has six mounting windows 24A and 24B for mounting the semiconductor switching elements 60A and 60B. The mounting windows 24A and 24B are rectangular openings that pass through from the first surface (the surface in which the conductive circuit 22 is arranged) up to the second surface (the surface on the side opposite to the first surface) of the control circuit board 20. The size of the openings is slightly larger than the outer shape (contour) of each of the semiconductor switching elements 60A and 60B. Three of the six mounting windows 24A and 24B (the first mounting windows 24A) are arranged in a line to constitute a first mounting window group 25A. The other three of the six mounting windows 24A and 24B (the second mounting windows 24B) are arranged in a line to constitute a second mounting window group 25B. The two mounting window groups 25A and 25B are arranged in parallel and spaced apart from each other.

The conductive circuit 22 is constituted by a control circuit 22B and a connection circuit 22A. The control circuit 22B has a predetermined pattern. One end thereof is arranged near the mounting windows 24A and 24B, and the other end, the details of which is not shown in the diagram, is connected to a terminal or terminals provided in the connector 23. The connection circuit 22A is arranged in a region between the two mounting window groups 25A and 25B on the control circuit board 20 and spaced apart from the control circuit 22B.

Figure 3:
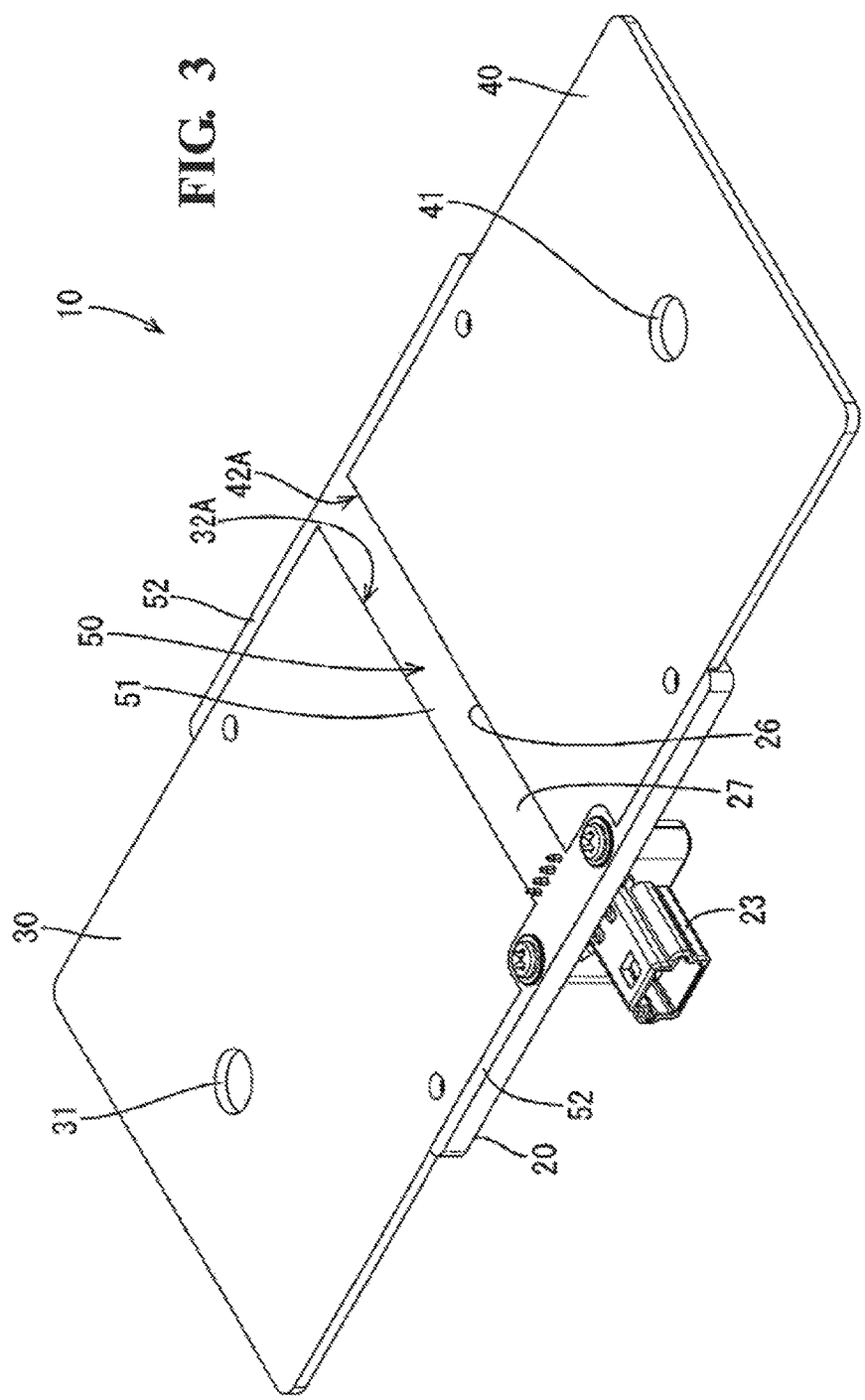
FIG. 3 is a perspective view of the switching board according to the embodiment as viewed from the bus bar side.

One of the two bus bars 30 and 40 is an input bus bar 30, and the other one is an output bus bar 40. As shown in FIG. 3, the input bus bar 30 is a rectangular thick plate made of a conductive material (copper or copper alloy in this embodiment). The input bus bar 30 includes a bolt insertion hole 31. The bolt insertion hole 31 is a through-hole that passes through from one plate surface down to the other plate surface of the input bus bar 30. The output bus bar 40 is also a rectangular thick plate made of a conductive material (copper or copper alloy in this embodiment), and has a bolt insertion hole 41, similarly to the input bus bar 30.

The input bus bar 30 and the output bus bar 40 are arranged on the second surface of the control circuit board 20. The input bus bar 30 and the output bus bar 40 are spaced apart from each other such that their end surfaces 32A and 42A that face each other are parallel. That is to say, a groove 26 defined by the end surface 32A of the input bus bar 30, the end surface 42A of the output bus bar 40, and the second surface of the insulating plate 21 is located between the input bus bar 30 and the output bus bar 40.

Partial regions of the input bus bar 30 and the output bus bar 40 overlap the control circuit board 20, and the regions where the bolt insertion holes 31 and 41 are arranged are located outside the control circuit board 20. A part of the input bus bar 30 is exposed to the inside of the first mounting windows 24A. A part of the output bus bar 40 is exposed to the inside of the second mounting windows 24B.

The separator 50 is arranged on the same surface of the control circuit board 20 as the surface in which the input bus bar 30 and the output bus bar 40 are arranged. The separator 50 includes a separating portion 51 arranged inside the groove 26, and two frame portions 52 arranged at respective ends of the separating portion 51. The separating portion 51 is a long and narrow rectangular plate, and is arranged between the input bus bar 30 and the output bus bar 40. The two frame portions 52 extend from both ends of the separator 50, perpendicular to the separator 50, and sandwich the input bus bar 30 and the output bus bar 40.

An exemplary method for forming the circuit structure 11 described as described above is as follows (see FIG. 9). Initially, the insulating plate 21 is overlapped with the bus bars 30 and 40 and the separator 50, with a prepreg 54, which is a base material of the adhesion layer 53, therebetween. Next, the stack constituted by the bus bars 30 and 40, the separator 50, the insulating plate 21, and the prepreg 54 is heat-pressed, and the prepreg 54 is cured to adhere the insulating plate 21 to the bus bars 30 and 40 and the separator 50. Note that the resin that constitutes the prepreg 54 flows due to the heat-press. A part of the resin enters a gap between the separator 50 and the input bus bar 30 and a gap between the separator 50 and the output bus bar 40 and is then cured. Thereafter, the insulating plate 21 is machined with a drill to form the mounting windows 24A and 24B, and the conductive circuit 22 is formed on the surface of the insulating plate 21.

The semiconductor switching elements 60A an 60B are power MOSFETs, and each includes a housing 61, and a drain terminal 62, a source terminal 63, and a gate terminal 64 that are provided in or at this housing 61. The drain terminal 62 is arranged at a lower surface of the housing 61. The source terminal 63 and the gate terminal 64 project from a side surface of the housing 61.

Three of the six semiconductor switching elements 60A and 60B (first semiconductor switching elements 60A) constitute a first element group 65A. The other three of the six semiconductor switching elements 60A and 60B (second semiconductor switching elements 60B) constitute a second element group 65B.

As shown in FIG. 4, the first semiconductor switching elements 60A are arranged inside the respective first mounting windows 24A. The drain terminal 62 is connected to a part of the input bus bar 30 that is exposed to the inside of the corresponding first mounting window 24A, the source terminal 63 is connected to the connection circuit 22A on the control circuit board 20, and the gate terminal 64 is connected to the control circuit 22B. Similarly, the second semiconductor switching elements 60B are arranged inside the respective mounting windows 24B. The drain terminal 62 is connected to a part of the output bus bar 40 that is exposed to the inside of the corresponding second mounting window 24B, the source terminal 63 is connected to the connection circuit 22A on the control circuit board 20, and the gate terminal 64 is connected to the control circuit 22B. The connection can be made by means of soldering H, for example.

As a result of such an arrangement, three semiconductor switching elements 60A and three semiconductor switching elements 60B that are arranged in parallel respectively form a set, and two sets of semiconductor switching elements 60A and 60B are connected in series. The two sets of semiconductor switching elements 60A and 60B are arranged back to back.

A plurality of semiconductor switching elements 60A and 60B are configured to constitute a set in order to deal with a large current. That is to say, the total amount of current that can flow through the power supply circuit can be increased by connecting the plurality of semiconductor switching elements 60A and 60B in parallel.

The two sets of semiconductor switching elements 60A and 60B are arranged back to back for the following reason.

In general, in a switch using a MOSFET, a parasitic diode due to a pn junction is generated between the source and the drain. Accordingly, a current flows through this parasitic diode from the source to the drain even if the gate is turned off, and therefore, a signal from the source to the drain cannot be turned off. For this reason, when the voltage of the auxiliary battery 91 is higher than that of the main battery 90 (e.g., when the engine is turned off at the time of stopping), there are cases where a current flows into the main battery 90 from the auxiliary battery 91 through the parasitic diode even though the switch is in an off state. By connecting two MOSFETs in series such that the orientations of the parasitic diodes are opposite, currents in both directions can be interrupted.

A fastening terminal 71A, which is connected to a harness 70A that leads to the main battery 90, is fixed to the input bus bar 30 by a power supply terminal 72A (stud bolt) inserted in the bolt insertion hole 31 and a nut 73A fastened to a tip of this power supply terminal 72A. A fastening terminal 71B, which is connected to a harness 70B that leads to the auxiliary battery 91, is fixed to the output bus bar 40 by a power supply terminal 72B (stud bolt) inserted in the bolt insertion hole 41 and a nut 73B fastened to a tip of this power supply terminal 72B.

The casing 80 includes a case 81 and a cover plate 82. The case 81 is a tray-like case having an outer shape that is slightly larger than the outer shape of the switching board 10. The case 81 covers the entire surface of the switching board 10 in which the control circuit board 20 is arranged. The cover plate 82 is a rectangular plate having the same outer shape as the outer shape of the control circuit board 20. The cover plate 82 is overlapped with the back side of a region of the switching board 10 where the control circuit board 20 is arranged. Both the case 81 and the cover plate 82 are made of synthetic resin.

According to this embodiment, it is possible to simply lay out the bus bars 30 and 40, the control circuit board 20, and the semiconductor switching elements 60A and 60B that are necessary for the switching board 10 arranged between the main battery 90 and the auxiliary battery 91, and to provide a switching board 10 having a simple configuration.

Figure 10:
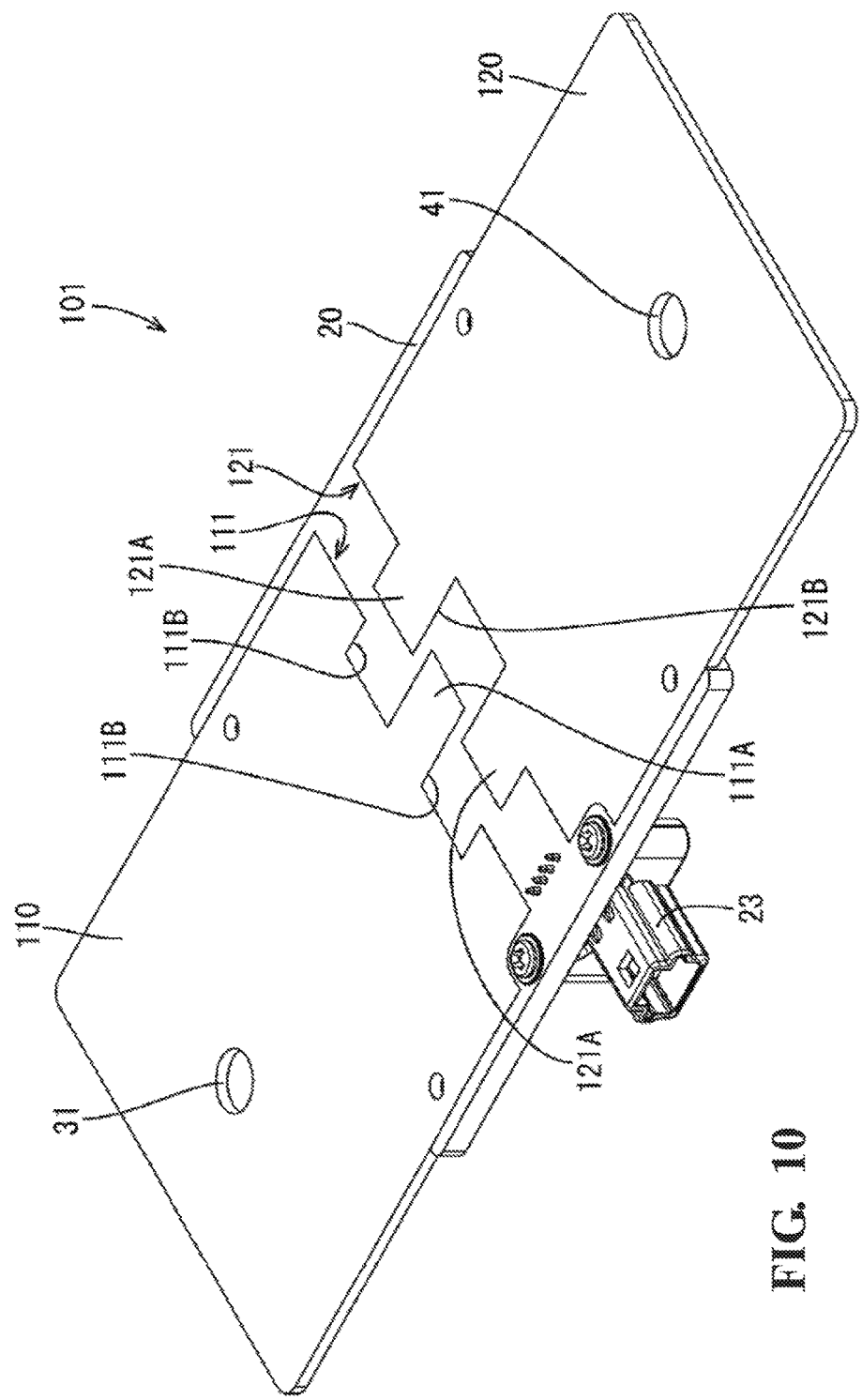
FIG. 10 is a perspective view of a switching board according to a modification as viewed from the bus bar side.

A modification of the present invention will be described with reference to FIG. 10. A switching board 101 according to this modification has a configuration similar to the embodiment except that an input bus bar 110 has first projecting portions 111A and first recess portions 111B, and an output bus bar 120 has second projecting portions 121A and second recess portions 121B. The configuration of the switching board 101 similar to the embodiment will be assigned the same signs, and descriptions thereof will be omitted.

The input bus bar 110 has a plurality of first projecting portions 111A that project toward the output bus bar 120 at an end edge 111 facing the output bus bar 120. The plurality of first projecting portions 111A are provided at a fixed pitch. A region between two adjacent first projecting portions 111A and 111A is a first recess portion 111B, which is recessed to the side opposite to the output bus bar 120.

The output bus bar 120 has a plurality of second projecting portions 121A that project toward the input bus bar 110 at an end edge 121 facing the input bus bar 110. The plurality of second projecting portions 121A are provided at a fixed pitch. A region between two adjacent second projecting portions 121A and 121A is a second recess portion 121B, which is recessed to the side opposite to the input bus bar 110.

The plurality of first projecting portions 111A and the plurality of second projecting portions 121A are alternately arranged. The plurality of first projecting portions 111A are each arranged so as to oppose the second recess portions 121B, and projecting ends thereof are located within the second recess portions 121B. The plurality of second projecting portions 121A are each arranged so as to oppose the first recess portions 111B, and projecting ends thereof are located within the first recess portions 111B.

With the above configuration, when unexpected large force is applied to the switching board 101, it is possible to avoid breakage of the control circuit board 20 along a gap between the input bus bar 110 and the output bus bar 120.

The present invention is not limited to the embodiment described with the above description and the drawings, and for example, the following embodiments are also included in the technical scope of the present invention.

(1) Although the above embodiment has described an example in which the separating portion 51 of the separator 50 is arranged within the groove 26, for example, the groove 26 may be filled by pouring thermosetting resin into the groove 26 and curing it after adhering the control circuit board 20 to the bus bars 30 and 40.

(2) Although the auxiliary power supply is the auxiliary battery 91 in the above embodiment, a battery device such as a secondary battery or an electrical double layer capacitor can be used as the auxiliary power supply, for example.

(3) Although three of the mounting windows 24A and 24B and three of the semiconductor switching elements 60A and 60B respectively form a set in this embodiment, the number of semiconductor switching elements for forming a set may be two, or may be four or more. Similarly, the number of mounting windows for forming a set may be two, or may be four or more.

The invention claimed is:

1. A switching board displaced between a main power supply and an auxiliary power supply of a vehicle, the switching board comprising:
   a circuit structure including: an insulating plate that has a first surface and a second surface and is made of an insulating material; a conductive circuit arranged on the first surface of the insulating plate; a control circuit board including a plurality of mounting windows that pass through from the first surface to the second surface of the insulating plate; and an input bus bar and an output bus bar that are spaced apart from each other on the second surface of the insulating plate; and
   a plurality of semiconductor switching elements mounted on the circuit structure and each having a drain terminal, a source terminal, and a gate terminal,
   wherein the conductive circuit includes a control circuit, and a connection circuit arranged between the input bus bar and the output bus bar,
   at least one of the plurality of mounting windows is a first mounting window, to the inside of which a part of the input bus bar is exposed, and at least another one of the mounting windows is a second mounting window, to the inside of which a part of the output bus bar is exposed, and
   at least one of the plurality of semiconductor switching elements is a first semiconductor switching element arranged inside the first mounting window, the drain terminal of the first semiconductor switching element being connected to a part of the input bus bar, the source terminal of the first semiconductor switching element being connected to the connection circuit, and the gate terminal of the first semiconductor switching element being connected to the control circuit, and at least another one of the semiconductor switching elements being a second semiconductor switching element arranged inside the second mounting window, the drain terminal of the second semiconductor switching element being connected to a part of the output bus bar, the source terminal of the second semiconductor switching element being connected to the connection circuit, and the gate terminal of the second semiconductor switching element being connected to the control circuit; and
   the first semiconductor switching elements are arranged in parallel to one another and connected to the connection bus bar; the second semiconductor switching elements are arranged in parallel to one another and connected to the connection bus bar so as to place the first semiconductor switching elements in series with the second semiconductor switching elements.

2. The switching board according to claim 1, wherein the input bus bar has, at an end edge facing the output bus bar side, a plurality of first projecting portions that project toward the output bus bar, and a first recess portion that is recessed to a side opposite to the output bus bar, the first recess portion being arranged between two adjacent first projecting portions, and
the output bus bar has, at an end edge facing the input bus bar, a plurality of second projecting portions that project toward the input bus bar, and a second recess portion that is recessed to a side opposite to the input bus bar, the second recess portion being arranged between two adjacent second projecting portions.

* * * * *